(12) United States Patent
Groe

(10) Patent No.: US 6,175,274 B1
(45) Date of Patent: Jan. 16, 2001

(54) SWITCHED GAIN LOW NOISE AMPLIFIER

(75) Inventor: John B. Groe, Poway, CA (US)

(73) Assignee: Nokia Mobile Phones Limited, Espo (FI)

( * ) Notice: Under 35 U.S.C. 154(b), the term of this patent shall be extended for 0 days.

(21) Appl. No.: 09/360,761

(22) Filed: Jul. 26, 1999

(51) Int. Cl.[7] .................................................. H03F 1/14
(52) U.S. Cl. ................................................ 330/51; 330/100
(58) Field of Search ................................ 330/51, 98, 99, 330/100, 151, 310, 311

(56) References Cited

U.S. PATENT DOCUMENTS

| 3,304,506 | * | 2/1967 | Weekes ............................ 330/100 X |
| 3,737,798 | * | 6/1973 | Faraguet et al. ................. 330/99 X |
| 4,563,652 | * | 1/1986 | Hofer ............................... 330/310 X |
| 5,590,412 | * | 12/1996 | Sawai et al. ...................... 330/310 X |
| 5,909,643 | * | 6/1999 | Aihara .............................. 330/51 X |

* cited by examiner

*Primary Examiner*—Steven J. Mottola

(57) ABSTRACT

A low noise amplifier for use in communications electronics includes first and second gain stages, switching circuitry that can switch the output of the first stage between the collector (common-emitter configuration) and the emitter (emitter-follower configuration) of the input transistor, thereby achieving high-gain or unity-gain, and an input-output path that can feed back a portion of the output signal to the input gain stage (high-gain mode) or couple a portion of the input signal directly to the output (low-gain mode) depending on the switch.

20 Claims, 3 Drawing Sheets

SWITCHED GAIN LOW NOISE AMPLIFIER

TECHNICAL FIELD OF THE INVENTION

This invention relates in general to communications electronics and, more specifically, to low noise amplifiers used in communications downconverters.

BACKGROUND OF THE INVENTION

The sensitivity of a typical communications receiver (i.e., the ability of the receiver to recover information in the presence of noise) depends, in part, on the noise figure of the receiver. This (the noise figure) is the excess noise generated by the receiver and translated to its input, as compared to the thermal noise (expressed in decibels). The noise figure of the receiver depends strongly on the performance of a low noise amplifier found at the front of the receiver.

An example of such an amplifier 10 is shown in FIG. 1. As shown, the low noise amplifier 10 includes a common-emitter gain stage that comprises an input capacitor 12 for receiving an RF signal, an inductor $L_e$ that provides emitter degeneration and helps set the input impedance $R_{IN}$ of the amplifier 10, and a bipolar transistor 14. In addition, the amplifier 10 may include a cascode stage for minimizing Miller capacitance and improving reverse isolation of the amplifier 10. The cascode stage comprises an AC grounding capacitor 16 and another bipolar transistor 18 that together receive a bias voltage $V_{bias}$, and a load element $Z_C$ that typically includes an inductor and resistor in parallel. The amplifier 10 may also include a bypass MOS transistor 20 that can bypass the common-emitter gain stage when the RF signal is strong.

It is desirable for the input impedance of the amplifier 10 to be 50Ω, both in its "normal" or "high-gain" mode (i.e., when the bypass transistor 20 is off) and in its "bypass" or "low-gain" mode (i.e., when the bypass transistor 20 is on). In the normal mode, the input impedance $R_{IN}$ of the amplifier 10 is determined in accordance with:

$$R_{IN} \approx r_\pi + \rho \beta L_e \qquad (1)$$

where $r_\pi$ is the small-signal base-emitter input resistance looking into the base of the bipolar transistor 14, $\rho$ is the dominant pole associated with $\beta$, and $\beta$ is the common-emitter current gain. The value of the inductor $L_e$ is selected from this equation.

There are several drawbacks to the design of this amplifier 10. For example, the required gain for the single-stage amplifier 10 is significant. Also, the inductor $L_e$ and the inductor in the load element $Z_C$ are typically off-chip, which allows these inductors to couple to input pins and destabilize the amplifier 10. Further, the amplifier 10 can be difficult to tune because the input impedance $R_{IN}$, the input compression point, and the noise figure of the amplifier 10 are set by transistor geometry, inductor degeneration, and quiescent current, all of which are heavily interdependent. In addition, it is difficult to get the bypass mode input impedance, which is set by the MOS transistor 20, to match the normal mode input impedance $R_{IN}$, which is set as discussed above.

Accordingly, there is a need in the art for an improved low noise amplifier.

SUMMARY OF THE INVENTION

An inventive amplifier (e.g., a low noise amplifier) includes a first gain stage that receives an input signal (e.g., an RF signal) and, in response, generates an amplified signal in, for example, the high-gain mode of the amplifier and a low-gain signal in the bypass mode of the amplifier. In the high-gain mode, switching circuitry outputs the amplified signal, and a second gain stage generates an output signal in response. Also, in the high-gain mode shunt circuitry feeds the output signal back to the first gain stage, and in the bypass mode feeds the low-gain signal forward as the output signal.

This inventive amplifier has improved matching of its bypass mode input impedance and its high-gain mode input impedance, improved stability due to the feedback through the shunt circuitry in the normal mode, and improved reverse isolation due to the two stage amplifier design.

In a further embodiment, the amplifier described above is incorporated into a communications downconverter that also includes an image rejection filter and a mixer.

In another embodiment, an inventive low noise amplifier generates an output voltage from an RF signal. The amplifier includes a first gain stage having a bipolar transistor that receives the RF signal at its base and generates an amplified signal at its collector in the normal mode of the amplifier and a low-gain signal at its emitter in the bypass mode of the amplifier. Also, switching circuitry includes first and second bipolar transistors with their emitters coupled to the collector of the first gain stage bipolar transistor, and an inverter coupled to the bases of the first and second bipolar transistors that receives a bypass signal and, in response, switches on the second bipolar transistor and switches off the first bipolar transistor for common-emitter operation of the first gain stage in the normal mode, and switches off the second bipolar transistor and switches on the first bipolar transistor for emitter-follower operation of the first gain stage in the bypass mode. In addition, a second gain stage includes a bipolar transistor with its base coupled to the collector of the second bipolar transistor of the switching circuitry that receives the amplified signal and generates the output voltage at its collector in the normal mode. Further, shunt circuitry includes an impedance network coupled between the collector of the second gain stage bipolar transistor and the emitter of the first gain stage bipolar transistor that feeds the output voltage back to the first gain stage in the normal mode and couples directly the emitter voltage at the first gain stage to the output of the second gain stage in the bypass mode.

In still another embodiment, an input signal is amplified by first receiving the input signal with a first gain stage. Then, in the normal mode, the first gain stage is switched into common-emitter operation, an amplified signal is generated from the input signal using the first gain stage, an output signal is generated from the amplified signal using a second gain stage, and the output signal is fed back to the first gain stage through shunt circuitry. Also, in the bypass mode, the first gain stage is switched into emitter-follower operation, a low-gain signal is generated from the input signal using the first gain stage, and the output signal is generated from the low-gain signal using the shunt circuitry.

DETAILED DESCRIPTION OF THE ILLUSTRATED EMBODIMENTS

Figure 1:
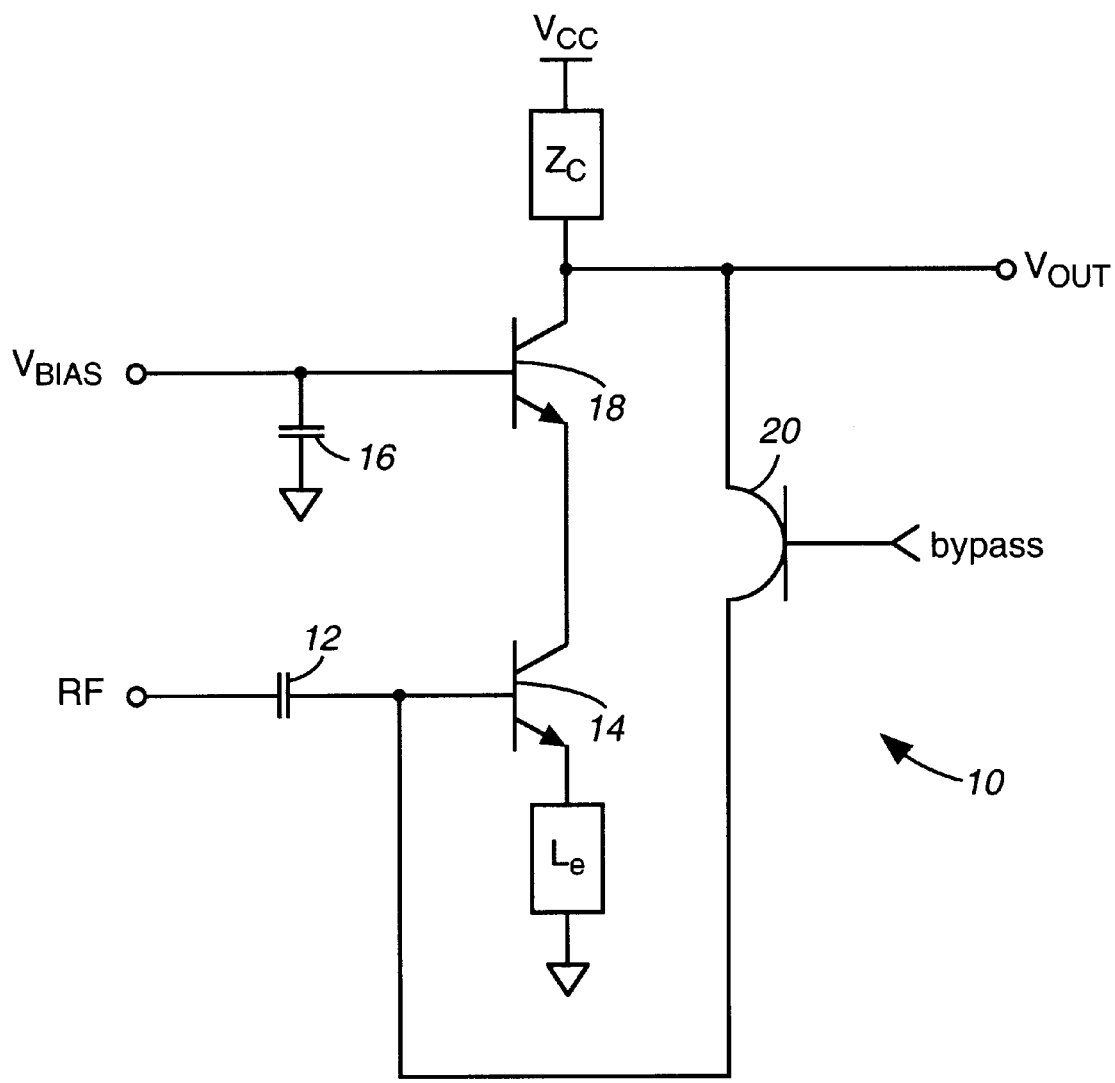
FIG. 1 is a circuit schematic illustrating a conventional low noise amplifier.
Figure 2:
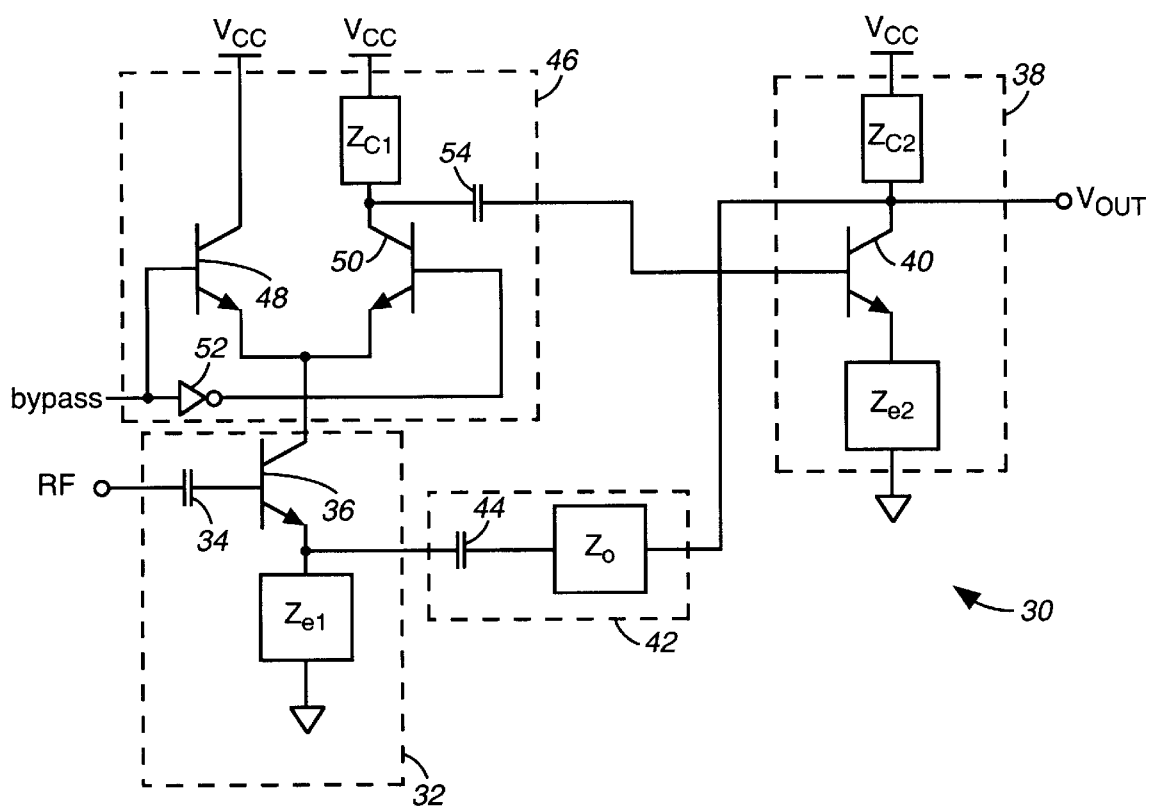
FIG. 2 is a circuit schematic illustrating a low noise amplifier in accordance with this invention.

As shown in FIG. 2, an improved low noise amplifier 30 in accordance with this invention includes a first gain stage 32 that comprises an input capacitor 34 for receiving an input RF signal, a bipolar transistor 36, and an impedance element $Z_{e1}$. A second gain stage 38 includes another bipolar transistor 40, a load element $Z_{c2}$, and an impedance element $Z_{e2}$. Also, a shunt circuit 42 includes an impedance network $Z_0$ and an AC coupling capacitor 44. Further, a switching block 46 includes a differential bipolar pair 48 and 50, an inverter 52, a load element $Z_{c1}$, and another AC coupling capacitor 54.

It will be understood by those having skill in the technical field of this invention that the amplifier 30 may be implemented using transistor technologies other than those illustrated in FIG. 2.

In the "normal" or "high-gain" mode of operation, a bypass signal turns the bipolar transistor 50 on and the bipolar transistor 48 off, causing the first gain stage 32 to operate as a cascode common-emitter gain stage. In this normal mode of operation, the shunt circuit 42 feeds a portion of the output voltage $V_{OUT}$ back to the first gain stage 32.

Also, in the "bypass" or "low-gain" mode of operation, the bypass signal turns the bipolar transistor 50 off and the bipolar transistor 48 on, causing the first gain stage 32 to operate as an emitter follower stage. In this bypass mode of operation, the shunt circuit 42 feeds the output of the first gain stage 32 forward to the second gain stage 38 as the output voltage $V_{OUT}$.

The improved low noise amplifier 30 has improved tuneability for matching the bypass mode input impedance to the normal mode input impedance, improved stability due to the shunt feedback, and improved reverse isolation due to the two stage amplifier design. In simulations, 20 dB of gain, low noise operation, and 50Ω matched input impedance with simple matching have been achieved (for both modes of operation).

Figure 3:
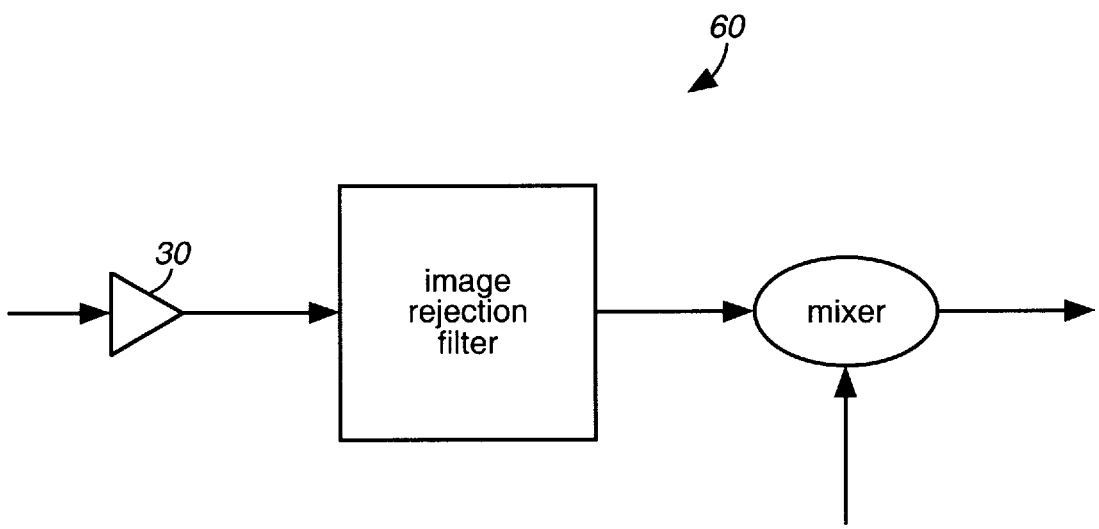
FIG. 3 is a block diagram illustrating a downconverter incorporating the low noise amplifier of FIG. 2.

As shown in FIG. 3, a downconverter 60 includes the low noise amplifier 30 of FIG. 2, an image rejection filter 62, and a mixer 64.

Although this invention has been described with reference to particular embodiments, the invention is not limited to these described embodiments. Rather, the invention is limited only by the appended claims, which include within their scope all equivalent devices and methods that operate according to the principles of the invention as described.

What is claimed is:

1. An amplifier having normal and bypass modes, the amplifier comprising:
   a first gain stage for receiving an input signal and, in response, generating an amplified signal in the normal mode and a low-gain signal in the bypass mode, the first gain stage including an impedance element and a bipolar junction transistor, the impedance element coupled to an emitter of the bipolar junction transistor;
   switching circuitry coupled to the first gain stage for outputting the amplified signal in the normal mode;
   a second gain stage coupled to the switching circuitry for generating an output signal in response to the amplified signal in the normal mode; and
   shunt circuitry coupled between the first and second gain stages for feeding the low-gain signal forward as the output signal in the bypass mode.

2. The amplifier of claim 1 wherein the switching circuitry includes:
   a differential pair of bipolar transistors with emitters coupled to the collector of the first gain stage bipolar transistor;
   an impedance element coupled to the collector of one of the differential pair bipolar transistors; and
   an inverter coupled to the differential pair of bipolar transistors for switching on the one of the pair with the impedance element and switching off the other of the pair in the normal mode for common-emitter operation of the first gain stage, and for switching off the one of the pair with the impedance element and switching on the other of the pair in the bypass mode for emitter-follower operation of the first gain stage.

3. The amplifier of claim 1 wherein the second gain stage comprises a common-emitter gain stage.

4. The amplifier of claim 1 wherein the shunt circuitry comprises an impedance element and a capacitor in series.

5. The amplifier of claim 1 wherein one or more of the first and second gain stages, the switching circuitry, and the shunt circuitry are tuned such that the input impedance of the amplifier is substantially the same in the normal and bypass modes.

6. A low noise amplifier for generating an output voltage from an RF signal, the amplifier having a normal mode and a bypass mode, the amplifier comprising:
   a first gain stage including:
      a bipolar transistor for receiving the RF signal at its base and generating an amplified signal at its collector in the normal mode and a low-gain signal at its emitter in the bypass mode; and
      an impedance element coupled to the emitter of the bipolar transistor;
   switching circuitry including:
      first and second bipolar transistors with their emitters coupled to the collector of the first gain stage bipolar transistor;
      an impedance element coupled to the collector of the second bipolar transistor; and
      an inverter coupled to the bases of the first and second bipolar transistors for receiving a bypass signal and, in response, switching on the second bipolar transistor and switching off the first bipolar transistor for common-emitter operation of the first gain stage in the normal mode and switching off the second bipolar transistor and switching on the first bipolar transistor for emitter-follower operation of the first gain stage in the bypass mode;
   a second gain stage including:
      a bipolar transistor with its base coupled to the collector of the second bipolar transistor of the switching circuitry for receiving the amplified signal and generating the output voltage at its collector in the normal mode; and
      first and second impedance elements coupled to the collector and emitter of the bipolar transistor; and
   shunt circuitry including an impedance element and a capacitor coupled in series between the collector of the second gain stage bipolar transistor and the emitter of the first gain stage bipolar transistor for feeding the output voltage back to the first gain stage in the normal mode and generating the output voltage from the low-gain signal in the bypass mode.

7. The amplifier of claim 6 wherein one or more of the first and second gain stages, the switching circuitry, and the shunt circuitry are tuned such that the input impedance of the amplifier is substantially the same in the normal and bypass modes.

8. A communications downconverter comprising:
   a low gain amplifier comprising:

a first gain stage for receiving an input signal and, in response, generating an amplified signal in the normal mode and a low-gain signal in the bypass mode;

switching circuitry coupled to the first gain stage for outputting the amplified signal in the normal mode;

a second gain stage coupled to the switching circuitry for generating an output signal in response to the amplified signal in the normal mode; and shunt circuitry coupled between the first and second gain stages for feeding the output signal back to the first gain stage in the normal mode and feeding the low-gain signal forward as the output signal in the bypass mode;

an image rejection filter coupled to the low gain amplifier; and a mixer coupled to the image rejection filter.

9. The downconverter of claim 8 wherein the first gain stage includes an impedance element coupled to the emitter of a bipolar transistor.

10. The downconverter of claim 9 wherein the switching circuitry includes:

a differential pair of bipolar transistors with emitters coupled to the collector of the first gain stage bipolar transistor;

an impedance element coupled to the collector of one of the differential pair bipolar transistors; and an inverter coupled to the differential pair of bipolar transistors for switching on the one of the pair with the impedance element and switching off the other of the pair in the normal mode for common-emitter operation of the first gain stage, and for switching off the one of the pair with the impedance element and switching on the other of the pair in the bypass mode for emitter-follower operation of the first gain stage.

11. The downconverter of claim 8 wherein the second gain stage comprises a common-emitter gain stage.

12. The downconverter of claim 8 wherein the shunt circuitry comprises an impedance element and a capacitor in series.

13. The downconverter of claim 8 wherein one or more of the first and second gain stages, the switching circuitry, and the shunt circuitry are tuned such that the input impedance of the amplifier is substantially the same in the normal and bypass modes.

14. A method for amplifying an input signal, the method comprising:

receiving the input signal with a first gain stage;

in a normal mode,
switching the first gain stage into common-emitter operation;
generating an amplified signal from the input signal using the first gain stage;
generating an output signal from the amplified signal using a second gain stage; and
feeding the output signal back to the first gain stage through shunt circuitry; and in a bypass mode,
switching the first gain stage into emitter-follower operation;
generating a low-gain signal from the input signal using the first gain stage; and
generating the output signal from the low-gain signal using the shunt circuitry.

15. The method of claim 14 wherein the act of receiving the input signal with a first gain stage includes receiving the input signal at the base of a bipolar transistor.

16. The method of claim 14 further comprising presenting the input signal with substantially the same impedance in the normal and bypass modes.

17. The method of claim 14 wherein the act of generating an output signal from the amplified signal using a second gain stage includes generating an output signal from the amplified signal using a second gain stage operating in a common-emitter configuration.

18. The method of claim 14 wherein the act of feeding the output signal back to the first gain stage through shunt circuitry includes feeding the output signal back to the first gain stage through shunt circuitry including an impedance block and a capacitor in series.

19. An amplifier having normal and bypass modes, the amplifier comprising:

a first gain stage for receiving an input signal and, in response, generating an amplified signal in the normal mode and a low-gain signal in the bypass mode;

switching circuitry coupled to the first gain stage for outputting the amplified signal in the normal mode;

a common-emitter gain stage coupled to the switching circuitry for generating an output signal in response to the amplified signal in the normal mode; and shunt circuitry coupled between the first gain stage and the common-emitter gain stage for feeding the output signal back to the first gain stage in the normal mode and feeding the low-gain signal forward as the output signal in the bypass mode.

20. An amplifier having normal and bypass modes, the amplifier comprising:

a first gain stage for receiving an input signal and, in response, generating an amplified signal in the normal mode and a low-gain signal in the bypass mode;

switching circuitry coupled to the first gain stage for outputting the amplified signal in the normal mode;

a second gain stage coupled to the switching circuitry for generating an output signal in response to the amplified signal in the normal mode; and shunt circuitry having an impedance element and a capacitor in series, said shunt circuitry coupled between the first and second gain stages for feeding the output signal back to the first gain stage in the normal mode and feeding the low-gain signal forward as the output signal in the bypass mode.

* * * * *